(12) United States Patent
Cok et al.

(10) Patent No.: US 6,320,325 B1
(45) Date of Patent: Nov. 20, 2001

(54) EMISSIVE DISPLAY WITH LUMINANCE FEEDBACK FROM A REPRESENTATIVE PIXEL

(75) Inventors: Ronald S. Cok, Rochester; Mark V. Hettel, Penfield, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/707,223

(22) Filed: Nov. 6, 2000

(51) Int. Cl.[7] ........................................................ G09G 3/10
(52) U.S. Cl. .................................... 315/169.3; 315/169.1; 315/169.2; 315/169.4; 345/76
(58) Field of Search .............................. 315/169.1, 169.3, 315/169.4, 169.2; 345/76

(56) References Cited

U.S. PATENT DOCUMENTS

| | | | |
|---|---|---|---|
| 4,535,341 | * 8/1985 | Kun et al. ........................ | 315/169.3 |
| 4,769,292 | 9/1988 | Tang et al. ........................ | 428/690 |
| 4,782,340 | * 11/1988 | Czubatyj et al. .................. | 340/825.83 |
| 5,061,569 | 10/1991 | VanSlyke et al. ................. | 428/457 |
| 5,157,525 | 10/1992 | Eaton et al. ....................... | 359/55 |
| 5,216,504 | 6/1993 | Webb et al. ....................... | 358/139 |
| 5,776,623 | 7/1998 | Hung et al. ....................... | 428/690 |
| 5,910,792 | 6/1999 | Hansen et al. .................... | 345/74 |
| 5,929,845 | 7/1999 | Wei et al. .......................... | 345/156 |
| 6,191,764 | * 2/2001 | Kono et al. ........................ | 345/76 |
| 6,208,091 | * 3/2001 | Beeteson et al. ................. | 315/169.3 |

* cited by examiner

Primary Examiner—Don Wong
Assistant Examiner—Jimmy T. Vu
(74) Attorney, Agent, or Firm—Thomas H. Close

(57) ABSTRACT

A digital image display device, having a substrate; a light emitting display formed on the substrate, the display having an array of light emitting pixels; a representative light emitting pixel formed on the substrate; a photosensor located on the display device and optically coupled to the representative light emitting pixel; and a feedback control circuit connected to the photosensor for modifying the light emitting display.

20 Claims, 1 Drawing Sheet

EMISSIVE DISPLAY WITH LUMINANCE FEEDBACK FROM A REPRESENTATIVE PIXEL

FIELD OF THE INVENTION

The present invention relates to solid-state flat-panel display devices and more particularly to such display devices having means to optimize the luminance of each pixel in the display through the use of optical feedback information from a representative pixel.

BACKGROUND OF THE INVENTION

Solid-state organic light emitting diode (OLED) image display devices are of great interest as a superior flat-panel digital display device. These display devices utilize current passing through thin films of organic material to generate light. The color of light emitted and the efficiency of the energy conversion from current to light are determined by the composition of the organic thin-film material. Moreover, the display devices can be made with exclusively transparent materials supporting the integration of other optical devices above and below an OLED display device. These organic materials can also be transparent. U.S. Pat. No. 5,776,623 issued Jul. 7, 1998 to Hung et al. entitled Transparent Electron-Injecting Electrode for Use in an Electroluminescent Device describes such a system.

Organic LED materials are also responsive to electromagnetic radiation, and when appropriately biased within an electrical circuit, can produce a current dependent on the ambient light. For example, U.S. Pat. No. 5,929,845 issued Jul. 27, 1999 to Wei et al. entitled Image Scanner and Display Apparatus describes a system which both emits and detects light using an organic electro-luminescent apparatus. Although the transparent organic emissive materials may emit only a limited frequency range of light, other absorptive materials can absorb a very broad spectrum and respond photo-electrically to the presence of light.

The luminance of the organic thin film material also depends upon the age of the material and its prior use. The material degrades over time and through use so that more and more current is required to achieve the same luminance. Moreover, current control in a display device is problematic, especially as compared to voltage control, requiring more circuitry and thus increasing the complexity of the supporting electronics within the display.

Attempts have been made in the prior art to optimize particular display systems to overcome some of the problems noted above. For example, U.S. Pat. No. 5,216,504 issued Jun. 1, 1993 to Webb et al. entitled Automatic Precision Video Monitor Alignment System describes a digital control device within a video monitor to calibrate or otherwise optimize the display, either with human input or under automated computer control.

Some systems integrate user-controlled control mechanisms to provide more flexible operation or optimal use under varying conditions. For example, brightness and contrast controls are often available on video and LCD display devices. These controls can be based on information from the device itself, using a representative pixel within the display. U.S. Pat. No. 5,157,525 issued Oct. 20, 1992 to Eaton et al. entitled Control of Liquid Crystal Display Visual Properties to Compensate for Variation in the Characteristics of the Liquid Crystal describes the use of a representative pixel with separate control to maintain a pre-selected value for contrast or absolute brightness using a feedback arrangement which includes an LCD reference element. The feedback information is determined by measuring the average transmissivity of the LCD material with a photo-detector. U.S. Pat. No. 5,910,792 issued Jun. 8, 1999 to Hansen et al. entitled Method and Apparatus for Brightness Control in a Field Emission Display compares current passing through a resistive layer with that of a current source to provide a feedback compensation for temperature-induced brightness variation. A significant problem with all these approaches is that the feedback does not directly respond to the emissivity of the pixels themselves, or address problems with different types (e.g. colors) of pixels within a display There is a need therefore for improved detection and control of light from an emissive display.

SUMMARY OF THE INVENTION

The need is met according to the present invention by providing a digital image display device having a substrate; a light emitting display formed on the substrate, the display having an array of light emitting pixels; a representative light emitting pixel formed on the substrate; a photosensor located on the display device and optically coupled to the representative light emitting pixel; and a feedback control circuit connected to the photosensor for modifying the light emitting display.

ADVANTAGES

The advantages of this invention are a digital image display device with improved performance. By integrating light detection capabilities together with feedback logic to control the operational characteristics of the display device, improved lifetime, better brightness, uniformity, and power consumption can all be achieved. The present invention provides a highly integrated, small, and lightweight means to provide optical feedback to emissive display devices. This feedback can lengthen the device lifetime, reduce power consumption, improve operating characteristics and provide flexibility in application.

DETAILED DESCRIPTION OF THE INVENTION

The present invention is directed to a solid-state display device with emissive pixels that overcomes the problems in the prior art through the use of optical detection capability located on the same substrate and optically coupled with a representative pixel for the display. The optical detection capability produces current dependent on the light emitted from the representative pixel. This current is then used as a feedback mechanism to control the current passed through the display pixels to achieve the desired output. Multiple representative pixels can be integrated to represent different pixels in the display, especially those of different colors.

Figure 1:
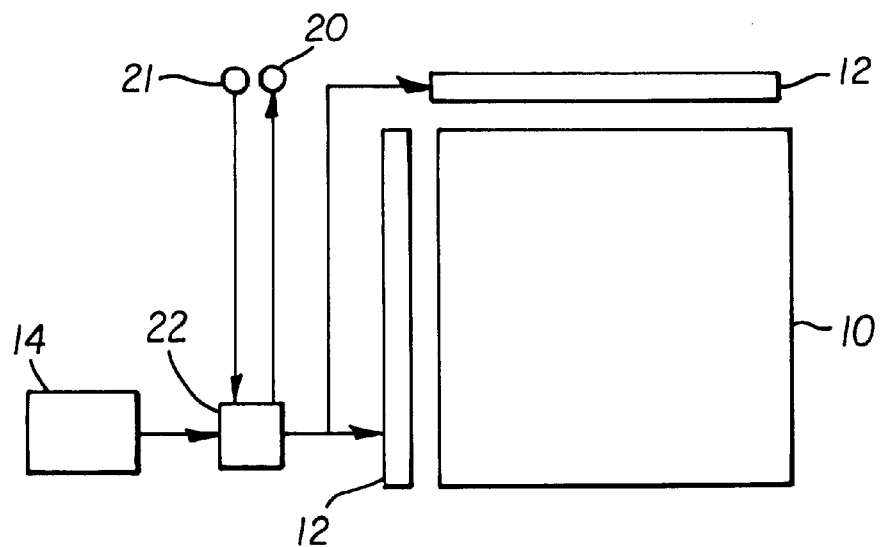
FIG. 1 is a schematic diagram of a display device with a photoelectrically active area and feedback circuitry according to the present invention.

FIG. 1 illustrates the present invention. In FIG. 1, a display device includes an array 10 of light emitting pixels on a substrate together with driver circuitry 12 and control circuitry 14. These components are all well known and practiced in commercial applications. The driver 12 and control circuitry 14 may be present on the same substrate as the pixel array but need not be. A representative pixel 20 and a photosensor 21 optically coupled to the representative pixel 20 are likewise constructed on the same substrate as the pixel array 10. The representative pixel 20 is as similar as is practicable to the individual pixels of the pixel array 10. In particular, the same emissive materials are used. The photosensor 21 is responsive to the light output by the representative pixel 20. The signal from the photosensor 21 is connected to a feedback circuit 22 which processes the signal and modifies the control signals provided to driver circuitry 12.

Figure 2:
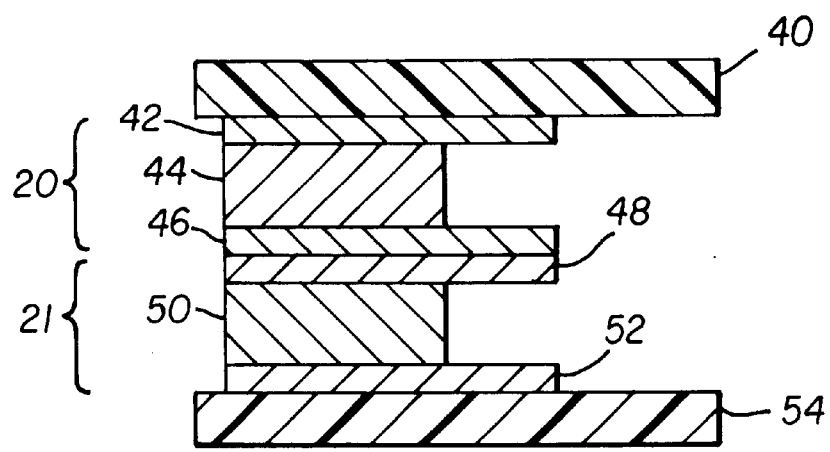
FIG. 2 is a cross sectional view of a preferred embodiment of the display device according to the present invention.

Referring to FIG. 2 a representative pixel 20 is formed on a substrate 40 upon which is deposited a patterned contact layer 42 which, in turn conducts signals to an emissive layer 44. A second transparent patterned contact layer 46 is connected to the other side of the emissive layer 44. These three layers comprise the representative pixel 20. It will be understood that the layers 42, 44, and 46 may be implemented in a variety of ways and may incorporate multiple layers themselves. The photosensor 21 includes a transparent patterned contact layer 48, a photosensor layer 50, and a second patterned contact layer 52. The device is encapsulated with a cover 54. Again, the three layers 48, 50, and 52 may themselves include multiple other layers depending on the technology used to implement them. Alternatively, the relative positions of the representative pixel 20 and the photosensor 21 may be reversed on the substrate 40. The transparent contact layers 46 and 48 may be common or may be separated by an insulator (not shown). According to another possible arrangement, the representative pixel 20 and the photosensor 21 may be arranged side by side on the substrate 40 in a manner such that they are optically coupled. In this arrangement, the contact layers 46 and 48 need not be transparent. In practice, the pixel array 10 may emit light through either the substrate 40 or cover 54 depending on the display system design.

It is also possible to locate a photosensor on the substrate or cover by affixing a discrete photodiode aligned with the representative pixel directly on to the display device. The photodiode can be affixed using optically clear adhesives or other suitable materials. The photodiode is then connected to the feedback circuit. These feedback circuits are known in the art. The representative pixel itself, while using the same materials and control logic as pixels in the display, may be much larger than a display pixel so as to provide enough light suitable for operating the photodiode.

In operation, the emissive layer 44 of the representative pixel 20 is energized using similar control signals as the array 10 of pixels. Light is emitted from the emissive layer 44 and is captured by the photo-sensitive layer 50. Hence, the signal layers 46 and 48 must be transparent to allow the light to be optically coupled from the representative pixel 20 to the photosensor 21. If either or both the cover 54 and substrate 40 are reflective, the light absorption by the photosensor can be enhanced. The signal from the photosensor is connected to the feedback circuitry 22 where it is analyzed.

The signal detected by the photosensor 21 is used to provide feedback from the light detected. Generally speaking, the signal generated is compared to a priori knowledge of the signal generated at the desired luminance. The signals driving the display materials are modified until the signal from the photosensor matches the desired signal. When this occurs, the light generated by the emissive materials is at the desired level. Note that as the light emissive materials degrade over time, become less efficient, and emit less light, the resulting photosensor signal will decrease, causing an increase in driving current to compensate, thus compensating for the reduced light output.

The analysis may include comparisons to desired signals from exemplary pixels, historical information on display performance, etc. The result of the analysis is used to modify the control signals operating the display. This modification can be done by changing the voltage applied to each pixel in the display, by modifying analog control signals, or by modifying digital codes representing pixel values.

If either the cover or substrate is transparent and the patterned contact layers are transparent, ambient light may be detected by the photosensor 21. In this case, compensation is necessary for the signal resulting from the ambient light and can be performed by the feedback circuitry 22 by measuring the ambient light in the absence of an energized emissive layer 50. This compensation can include making the display brighter in the presence of ambient illumination or power saving in darker conditions. This compensation can also improve the lifetime of a display device. The compensation also includes adjustments due to changes in emissive efficiency due to environment conditions or age.

In a preferred embodiment of the present invention, common processes, substrate materials, and light-responsive elements are utilized to create a completely integrated display device and photosensor. Depending on the manufacturing process used, it may be preferable to construct the photosensor layers first. Alternatively, the emissive layers may be deposited first. In any case, OLED materials may be used for the emissive components as well as the photosensor. Alternatively, a variety of silicon materials can be used to construct the photosensor.

Different display materials are used to produce light of different colors and these different materials may have different efficiency and aging characteristics. Just as each brightness level can be calibrated, each color can be calibrated. In the case of a single feedback photoelectric element, by simply energizing only one color of the representative pixel at a time, a suitable reference value can be measured for each color. If implemented digitally, the color and brightness calibration are simply implemented using a 256 by 3 entry lookup table (for an 8-bit system), a technique very common in the art. Alternatively, representative pixels and associated photoelectric elements can be created for each of the colors in the display device. By extension, a separate representative pixel can be created for each different type of pixel element.

The feedback signal can be continuously updated by operating the pixel at the same time as the array or it can be updated periodically. Moreover, if the feedback incorporates a digital lookup table to modify the pixel values, a separate representative pixel can be employed for each table element. Alternatively, the same effect can be obtained by exercising the representative pixel at each of the emission levels used in the display and using the feedback information gathered to calibrate the display device. Note that the operation of the representative pixel(s) will not affect the operation of the pixel array in the display.

It is also possible to maximize the signal from the representative pixel by making it much larger than the light emitting pixels in the display. This reduces noise in the system, enhancing the feedback, but makes the representative pixel less representative of the display pixels in the array.

The detection, calibration, and feedback circuitry can be integrated directly onto the same substrate as the display device or it can be implemented externally to the display. In general, higher performance and greater accuracy can be achieved by integrating the circuitry directly with the display device but this may not be desirable for all display devices. (For example, the pixel technology and manufacturing process may inhibit the integration of circuitry and logic.) The present invention can be applied to both active- and passive-matrix display devices.

Organic Light Emitting Diodes (OLEDs) including small molecule polymeric OLEDs as disclosed in but not limited to U.S. Pat. No. 4,769,292 issued Sep. 6, 1998 to Tang et al. entitled Electroluminescent Device with Modified Thin Film Luminescent Zone, and U.S. Pat. No. 5,061,569 issued Oct. 29, 1991 to VanSlyke et al. entitled Electroluminescent Device with Organic Electroluminescent Medium provide a technical platform on which a suitable display device can be created. Many combinations and variations of OLED materials would be apparent to those knowledgeable in the art and can be used to fabricate such a device and are included in this invention.

The invention has been described in detail with particular reference to certain preferred embodiments thereof, but it will be understood that variations and modifications can be effected within the spirit and scope of the invention.

PARTS LIST 10 light emitting pixel array
12 driver circuitry
14 control circuitry
20 representative pixel
21 photo sensor
22 feedback circuit
40 substrate
42 patterned contact layer
44 emissive layer
46 patterned contact layer
48 patterned contact layer
50 photo-sensitive layer
52 patterned contact layer
54 cover

What is claimed is:

1. A digital image display device, comprising:
   a) a substrate;
   b) a light emitting display formed on the substrate, the display having an array of light emitting pixels;
   c) a representative light emitting pixel formed on the substrate;
   d) a photosensor located on the display device and optically coupled to the representative light emitting pixel to produce a feedback signal; and
   e) a feedback control circuit connected to the photosensor and responsive to the feedback signal for modifying control signals for operating the light emitting display.

2. The device claimed in claim 1, wherein the photosensor is a silicon photodiode.

3. The device claimed in claim 1, wherein the light emitting pixels of the display and the representative light emitting pixel are OLEDs.

4. The device claimed in claim 1, wherein the photosensor is a reverse biased OLED.

5. The device claimed in claim 1, wherein the photo sensor is located above or below the representative pixel and further comprising a reflective layer located on either side of the photosensor and the representative pixel.

6. The device claimed in claim 1, wherein the representative pixel is significantly larger than a display pixel and whereby the measurement of light output is improved.

7. The device claimed in claim 1, wherein the display contains different types of light emitting pixels and the device includes a separate representative pixel for each different type of pixel in the display.

8. The device claimed in claim 1, wherein the light emitting pixels in the display can provide different brightness levels and a separate representative pixel is used for each of the different brightness levels produced by the display device.

9. The device claimed in claim 7, wherein the different types of light emitting pixels emit light of different colors, and the device includes a separate representative pixel is used for each of the different colors produced by the display device.

10. The device claimed in claim 1, wherein the feedback control circuit is integrated on the substrate.

11. The device claimed in claim 1, wherein the photosensor is responsive to ambient light.

12. The device claimed in claim 11, wherein the feedback control circuit compensates for the ambient light.

13. The device claimed in claim 1, wherein the feedback control circuit provides continuous feedback control to the light emitting display.

14. The device claimed in claim 1, wherein the feedback control circuit controls the voltage applied to the light emitting pixels of the display.

15. The device claimed in claim 1, wherein the feedback control circuit modifies the response to the code values used to represent pixel brightness.

16. The device claimed in claim 1, wherein the photosensor is integrated on the substrate.

17. The device claimed in claim 1, wherein the photosensor is affixed to the substrate.

18. The device claimed in claim 1, further comprising a cover over the display device, and wherein the photosensor is affixed to the cover.

19. The device claimed in claim 1, wherein the display is an active matrix display.

20. The device claimed in claim 1, wherein the display is a passive matrix display.

* * * * *